United States Patent
Lee et al.

(10) Patent No.: US 10,715,054 B2
(45) Date of Patent: Jul. 14, 2020

(54) POWER CONVERSION DEVICE AND PHOTOVOLTAIC MODULE INCLUDING THE SAME

(71) Applicants: LG ELECTRONICS INC., Seoul (KR); POSTECH ACADEMY-INDUSTRY FOUNDATION, Pohang-si, Gyungsangbuk-do (KR)

(72) Inventors: Suchang Lee, Seoul (KR); Youngchan Park, Seoul (KR); Hyeonseok Lee, Gunsan-si (KR); Yoongeol Choi, Seoul (KR); Juhwan Yun, Seoul (KR); Bongkoo Kang, Pohang-si (KR)

(73) Assignees: LG ELECTRONICS INC., Seoul (KR); POSTECH ACADEMY-INDUSTRY FOUNDATION, Pohang-si, Gyungsangbuk-do (KR)

( * ) Notice: Subject to any disclaimer, the term of this patent is extended or adjusted under 35 U.S.C. 154(b) by 0 days.

(21) Appl. No.: 16/435,052

(22) Filed: Jun. 7, 2019

(65) Prior Publication Data

US 2019/0312526 A1    Oct. 10, 2019

Related U.S. Application Data

(63) Continuation of application No. 15/907,901, filed on Feb. 28, 2018, now Pat. No. 10,361,641.

(30) Foreign Application Priority Data

Feb. 28, 2017 (KR) .................. 10-2017-0026409

(51) Int. Cl.
*H02M 7/00* (2006.01)
*H02M 7/5387* (2007.01)
(Continued)

(52) U.S. Cl.
CPC ........ *H02M 7/5387* (2013.01); *H01L 31/042* (2013.01); *H02J 7/345* (2013.01);
(Continued)

(58) Field of Classification Search
CPC .......... H02M 3/22; H02M 3/24; H02M 3/325; H02M 3/335; H02M 3/28; H02M 3/33569; H02M 7/5383
See application file for complete search history.

(56) References Cited

U.S. PATENT DOCUMENTS

2006/0062034 A1    3/2006  Mazumder et al.
2012/0230066 A1*   9/2012  Lai ..................... H02M 7/4807
                                                    363/37
(Continued)

OTHER PUBLICATIONS

Pinheiro et al., "Zero Voltage Switching Series Resonant Based DC-AC Converter," IEEE Canadian Conference on Electrical and Computer Engineering, vol. 2, Waterloo, Ont., Canada, May 24-28, 1998, pp. 549-552, XP010284939.
(Continued)

*Primary Examiner* — Adolf D Berhane
*Assistant Examiner* — Afework S Demisse
(74) *Attorney, Agent, or Firm* — Birch, Stewart, Kolasch & Birch, LLP

(57) ABSTRACT

A power conversion device includes a coupled inductor having a first inductor and second inductor, connected to a DC source; a full-bridge switching unit including a first leg having a first switching element and a second switching element serially connected to the first switching element, and a second leg having a third switching element and a fourth switching element serially connected to the third switching element, wherein the first leg connected to the first inductor and the second leg connected to the second inductor; a transformer connected to the full-bridge switching
(Continued)

unit; a third inductor connected in parallel with the transformer; and a storage capacitor connected to the full-bridge switching unit.

20 Claims, 19 Drawing Sheets

(51) Int. Cl.
    *H02M 5/18* (2006.01)
    *H02M 5/458* (2006.01)
    *H02J 7/35* (2006.01)
    *H01L 31/042* (2014.01)
    *H02J 7/34* (2006.01)
    *H02S 40/34* (2014.01)
    *H02M 1/00* (2006.01)

(52) U.S. Cl.
    CPC ............... *H02J 7/35* (2013.01); *H02M 5/18* (2013.01); *H02M 5/4585* (2013.01); *H02S 40/34* (2014.12); *H02M 2001/007* (2013.01); *H02M 2001/0032* (2013.01); *Y02B 70/16* (2013.01); *Y02E 10/56* (2013.01)

(56) References Cited

U.S. PATENT DOCUMENTS

| 2014/0268908 A1* | 9/2014 | Zhou | H02M 7/5381 |
| | | | 363/21.03 |
| 2014/0268959 A1 | 9/2014 | Frohman et al. | |
| 2015/0124487 A1* | 5/2015 | Fu | H02M 3/33569 |
| | | | 363/17 |

OTHER PUBLICATIONS

Trubitsyn et al., "High-Efficiency Inverter for Photovoltaic Applications," IEEE Energy Conversions Congress and Exposition (ECCE), Piscataway, NJ, USA, Sep. 12, 2010, pp. 2803-2810, XP031787370.

* cited by examiner

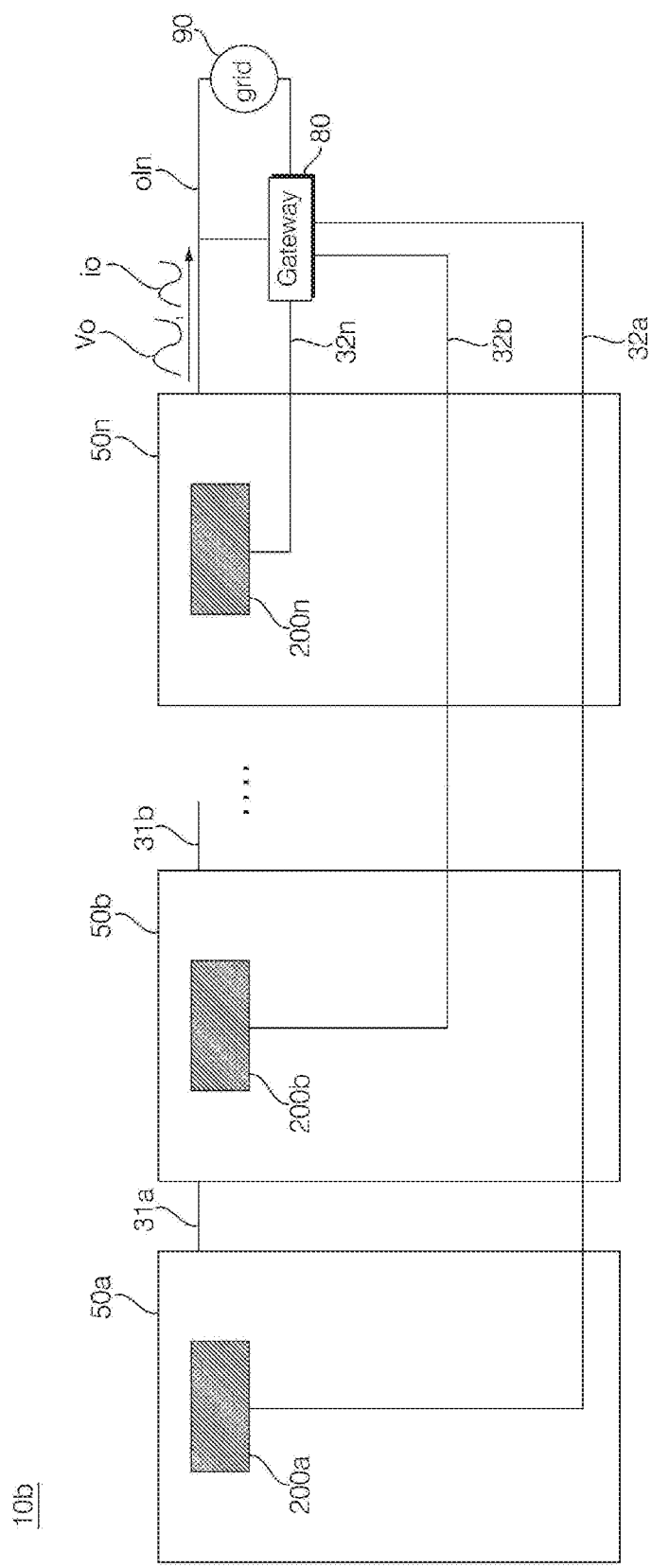

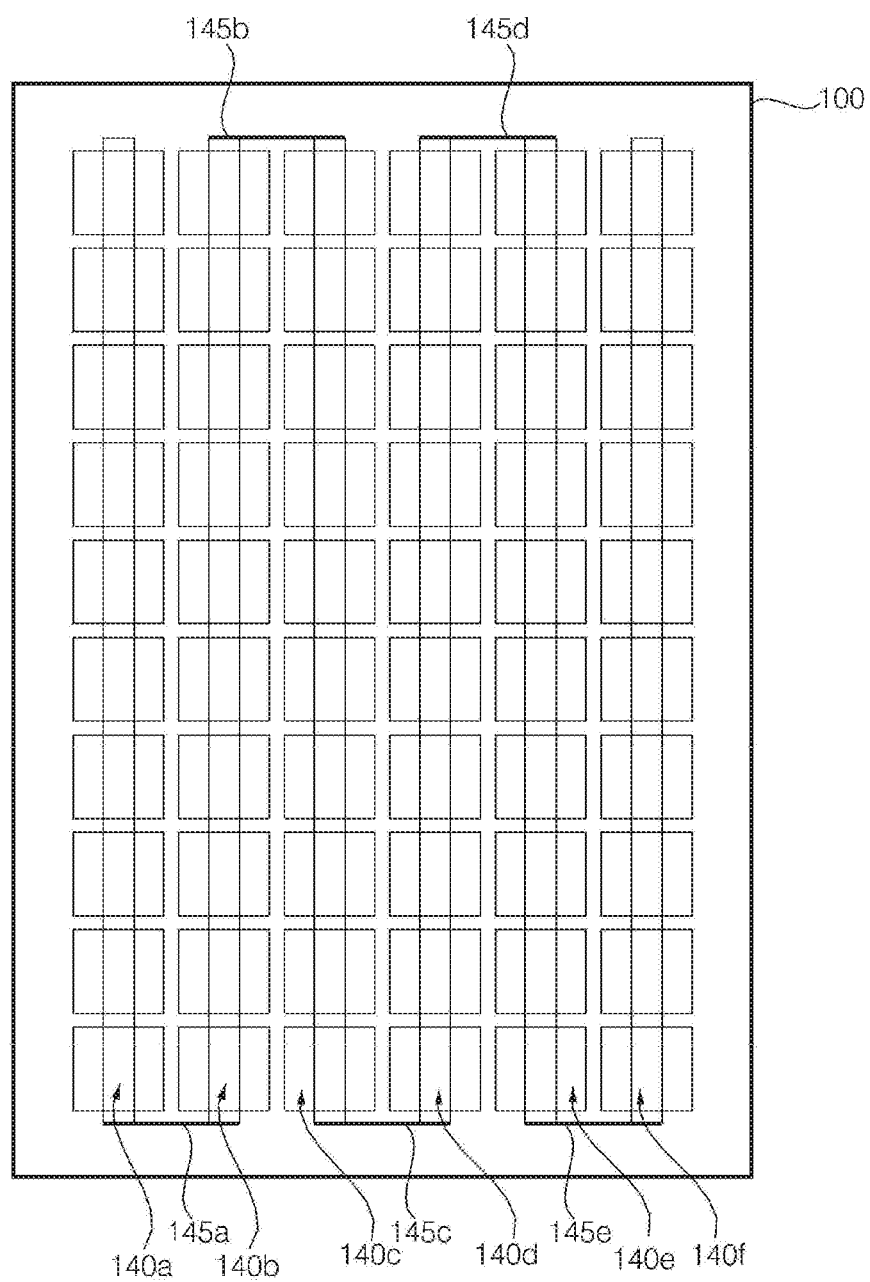

POWER CONVERSION DEVICE AND PHOTOVOLTAIC MODULE INCLUDING THE SAME

CROSS-REFERENCE TO RELATED APPLICATIONS

This application is a Continuation of U.S. patent application Ser. No. 15/907,901, filed on Feb. 28, 2018, which claims the priority benefit of Korean Patent Application No. 10-2017-0026409, filed on Feb. 28, 2017 in the Korean Intellectual Property Office, the contents of all these applications are incorporated herein by reference in their entirety.

BACKGROUND OF THE INVENTION

Field of the Invention

The present invention relates to a power conversion device and a photovoltaic module including the same, and more particularly to a power conversion device of one stage which is capable of performing direct current (DC) power boosting and alternating current (AC) power output, and a photovoltaic module including the same.

Description of the Related Art

Recently, as it is expected that existing energy resources such as oil or coal will be exhausted, interest in alternative energy resources to replace the existing energy resources has been increasing. There among, solar cells are in the spotlight as next-generation cells for directly converting sunlight into electric energy using semiconductor devices.

In a photovoltaic module, solar cells for photovoltaic power generation are connected in series or in parallel.

Meanwhile, when a photovoltaic module outputs AC power to a grid using an inverter, it is desirable to reduce loss of output power. Therefore, a method of reducing loss of power output from the photovoltaic module has been studied.

SUMMARY OF THE INVENTION

Therefore, the present invention has been made in view of the above problems, and it is an object of the present invention to provide a power conversion device of one stage capable of performing DC power boosting and AC power output, and a photovoltaic module including the same.

It is another object of the present invention to provide a power conversion device of one stage capable of reducing switching loss and a photovoltaic module including the same.

In accordance with the present invention, the above and other objects can be accomplished by the provision of A power conversion device, including a full-bridge switching unit including first to fourth switching elements, a first transformer having an input terminal connected between the first switching element and the second switching element in the full-bridge switching unit and an output terminal connected between the third switching element and the fourth switching element in the full-bridge switching unit, wherein the first switching element is serially connected to the second switching element, and the third switching element is serially connected to the fourth switching element, and a second transformer connected to the full-bridge switching unit as a half-bridge, wherein the full-bridge switching unit coverts a first direct current (DC) power input to the first transformer into a first alternating current (AC) waveform, based on variable duty switching.

In accordance with another aspect of the present invention, there is provided a photovoltaic module, including a solar cell module including a plurality of solar cells, and a power conversion device, wherein the power conversion device includes a full-bridge switching unit including first to fourth switching elements, a first transformer having an input terminal connected between the first switching element and the second switching element in the full-bridge switching unit and an output terminal connected between the third switching element and the fourth switching element in the full-bridge switching unit, wherein the first switching element is serially connected to the second switching element, and the third switching element is serially connected to the fourth switching element, and a second transformer connected to the full-bridge switching unit as a half-bridge, and wherein the full-bridge switching unit coverts a first direct current (DC) power input to the first transformer into a first alternating current (AC) waveform, based on variable duty switching.

BRIEF DESCRIPTION OF THE DRAWINGS

The above and other objects, features and other advantages of the present invention will be more clearly understood from the following detailed description taken in conjunction with the accompanying drawings, in which:

FIG. 1B is a view illustrating another exemplary photovoltaic system including a photovoltaic module according to an embodiment of the present invention;

FIG. 2 is a front view of a photovoltaic module according to an embodiment of the present invention;

DETAILED DESCRIPTION OF THE EMBODIMENTS

The present specification proposes a method of controlling a power factor, which is a phase difference between an AC current and an AC voltage, output from a photovoltaic module, as a method of reducing loss of a power output from the photovoltaic module.

Hereinafter, the present invention will be described in detail with reference to the attached drawings.

The suffixes "module" and "unit" in elements used in description below are given only in consideration of ease in preparation of the specification and do not have specific meanings or functions. Therefore, the suffixes "module" and "unit" may be used interchangeably.

Figure 1A:
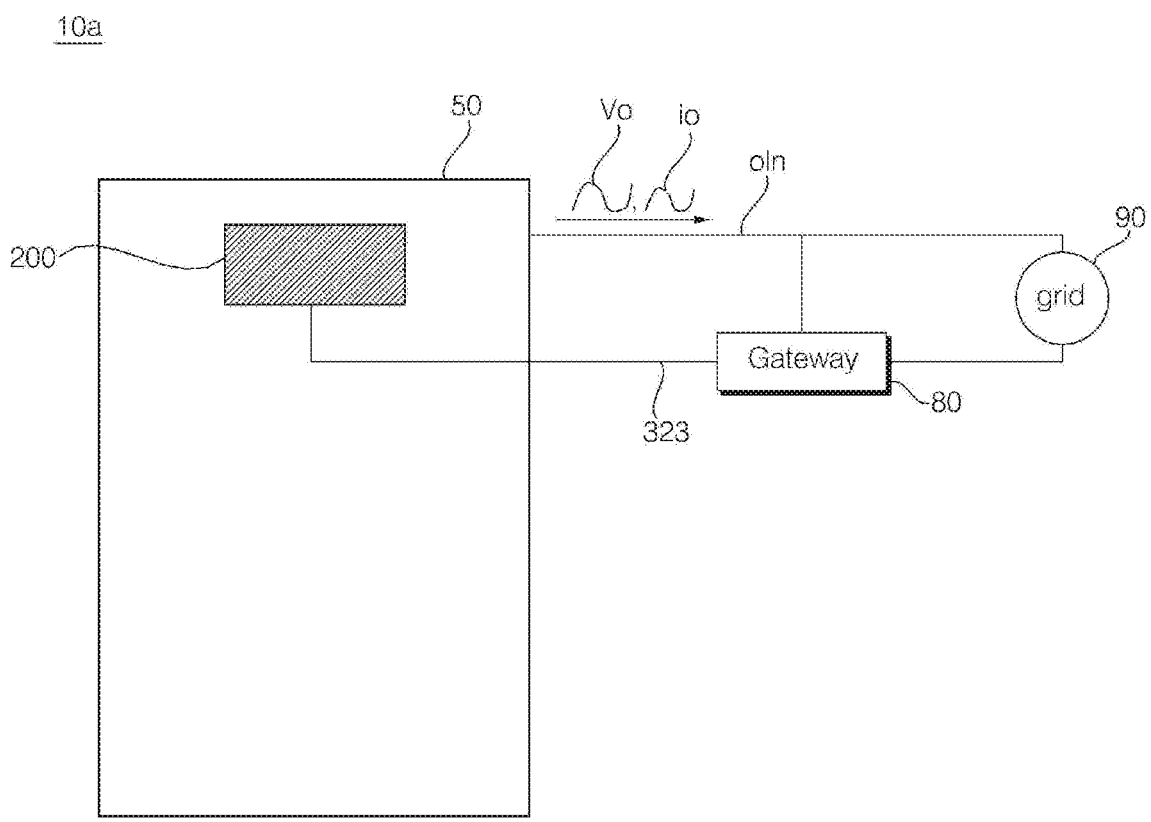
FIG. 1A is a view illustrating an exemplary photovoltaic system including a photovoltaic module according to an embodiment of the present invention.

FIG. 1A is a view illustrating an exemplary photovoltaic system including a photovoltaic module according to an embodiment of the present invention.

Referring to FIG. 1A, a photovoltaic system 10a according to an embodiment of the present invention may include a photovoltaic module 50 and a gateway 80.

The photovoltaic module 50 may include a solar cell module 100 and a junction box 200 which includes a power conversion device (500 in FIG. 5) for converting DC power output from the solar cell module into AC power.

Although the junction box 200 is illustrated as being attached to the back surface of the solar cell module 100, the present invention is not limited thereto. The junction box 200 may be separately disposed from the solar cell module 100.

Meanwhile, a cable oln for supplying the AC power output from the junction box 200 to a grid 90 may be electrically connected to an output terminal of the junction box 200.

The gateway 80 may be disposed between the junction box 200 and the grid 90.

The gateway 80 may detect an AC current io and an AC voltage Vo output from the photovoltaic module 50 via the cable oln.

The gateway 80 may output a power factor signal for adjusting a power factor, based on a phase difference between the AC current io and the AC voltage Vo output from the photovoltaic module 50.

To this end, the gateway 80 and the photovoltaic module 50 may perform power line communication (PLC) using a cable 323.

Meanwhile, the power conversion device (500 in FIG. 5) in the photovoltaic module 50 may convert the DC power output from the solar cell module 100 into AC power.

In the present invention, the power conversion device (500 in FIG. 5) for converting the DC power of the solar cell module of about 300 to 400 W into the AC power by one stage is described.

Figure 5:
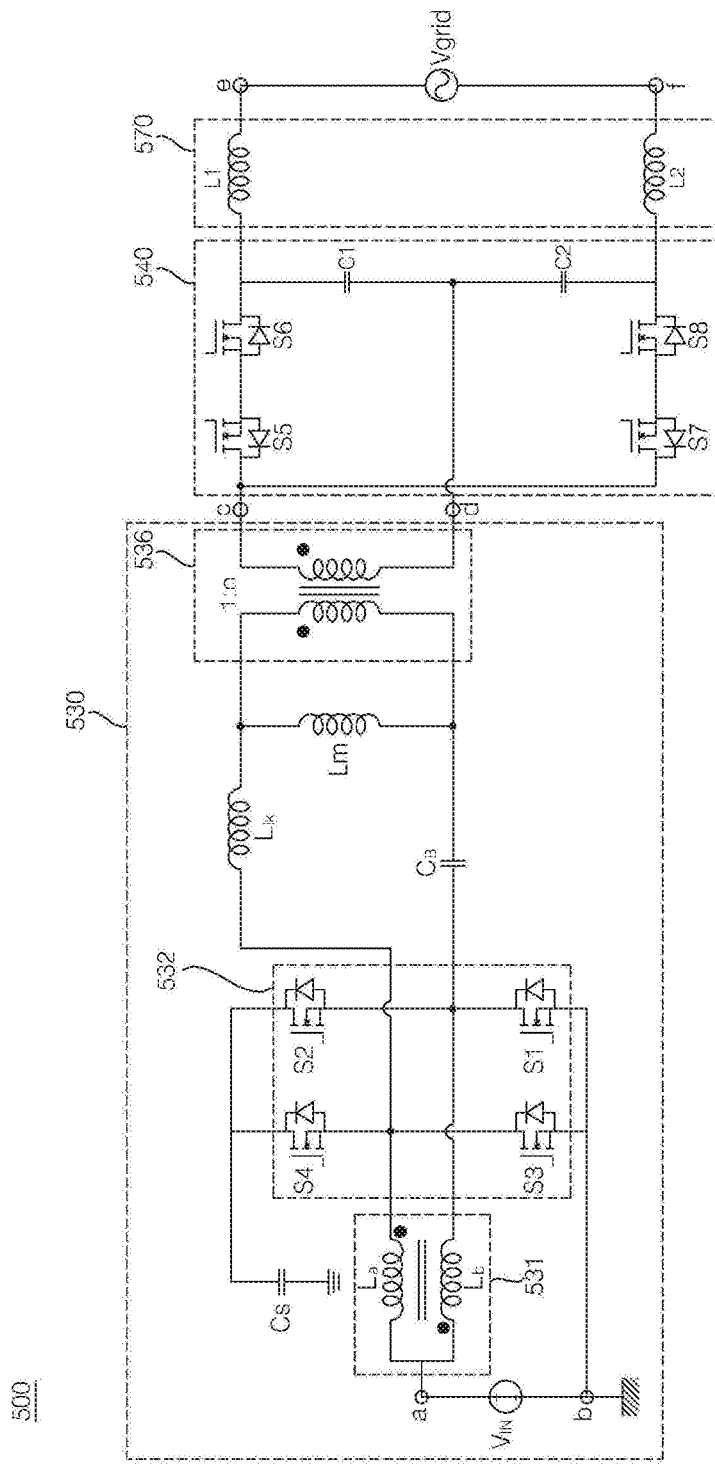
FIG. 5 is a circuit diagram of a power conversion device in a photovoltaic module according to an embodiment of the present invention.

To this end, the power conversion device (500 in FIG. 5) includes a full-bridge switching unit (532 in FIG. 5), a first transformer (531 in FIG. 5), and a second transformer (536 in FIG. 5) and converts a first DC power input to the first transformer (531 in FIG. 5) into a first AC waveform, based on variable duty switching of the full-bridge switching unit (532 in FIG. 5). Thus, DC power boosting and AC power output may be performed by one stage.

The present invention proposes a method of reducing loss of an output power in a one-stage based power conversion device. Especially, the present invention proposes a method of configuring zero-voltage switching (ZVS) in the full-bridge switching unit (532 in FIG. 5). This will be described later with reference to FIG. 5.

FIG. 1B is a view illustrating another exemplary photovoltaic system including a photovoltaic module according to an embodiment of the present invention.

Referring to FIG. 1B, a photovoltaic system 10b according to an embodiment of the present invention may include a plurality of photovoltaic modules 50a, 50b, . . . , 50n and a gateway 80.

The photovoltaic system 10b of FIG. 1B is different from the photovoltaic system 10a of FIG. 1A in that the plural photovoltaic modules 50a, 50b, . . . , 50n are connected in parallel.

Figure 3:
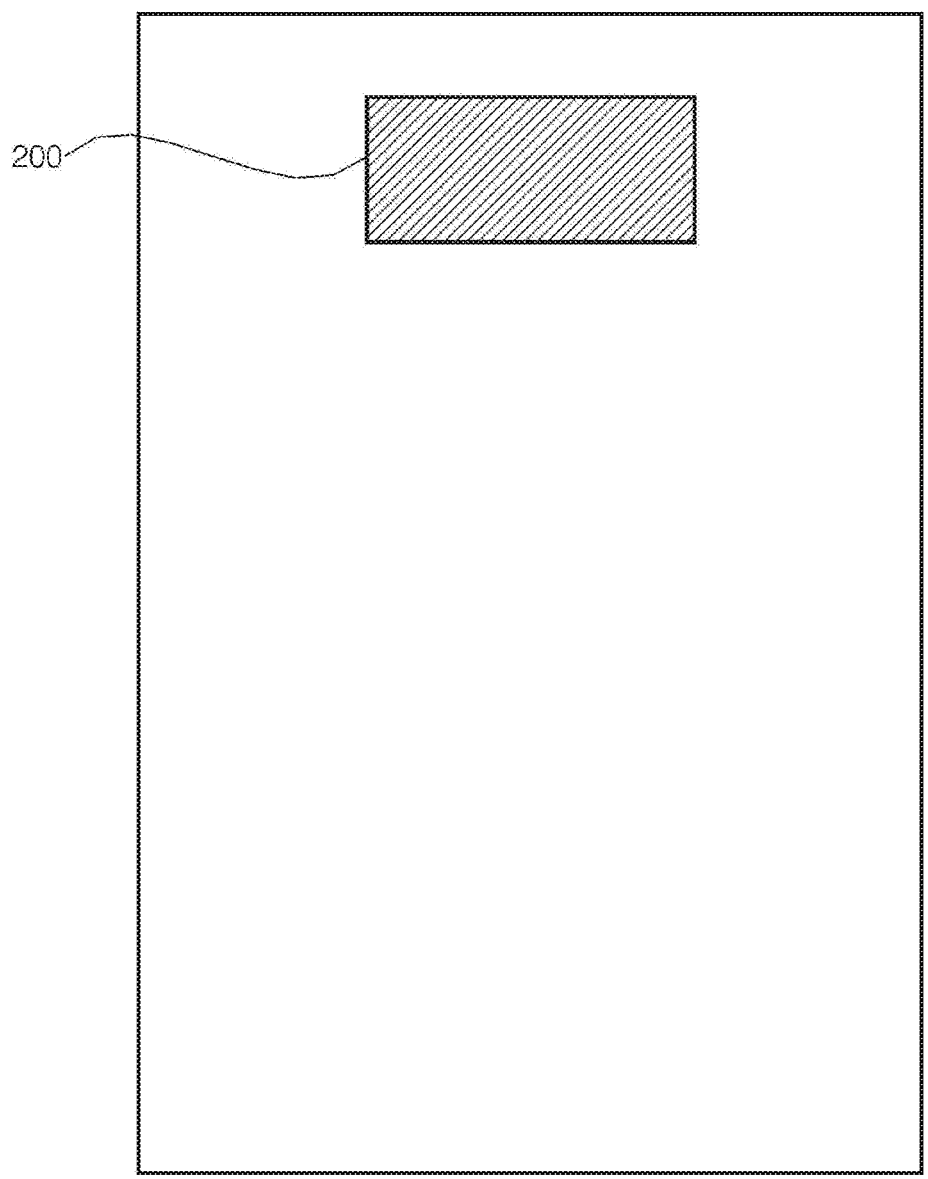
FIG. 3 is a rear view of the photovoltaic module of FIG. 2.

The photovoltaic modules 50a, 50b, . . . , 50n include respective solar cell modules 100a, 100b, . . . , 100n (see FIG. 3 showing one solar cell module 100), and respective junction boxes 200a, 200b, . . . , 200n each including a circuit element for converting DC power of a solar cell module into AC power.

Although the junction boxes 200a, 200b, . . . , 200n are illustrated as being respectively attached to the back surfaces of the solar cell modules 100a, 100b, . . . , 100n, the present invention is not limited thereto. The junction box 200a, 200b, . . . , 200n may be separately disposed from the solar cell modules 100a, 100b, . . . , 100n, respectively.

Meanwhile, cables 31a, 31b, . . . , oln for supplying AC power output from the junction boxes 200a, 200b, . . . , 200n to a grid 90 may be electrically connected to output terminals of the junction boxes 200a, 200b, . . . , 200n, respectively. Additionally, respective cables 32a, 32b, . . . , 32n for power line communication (PLC) between the photovoltaic modules 50a, 50b, . . . , 50n (e.g., the junction boxes 200a, 200b, . . . , 200n) and the gateway 80, respectively, are present.

FIG. 2 is a front view of a photovoltaic module according to an embodiment of the present invention. FIG. 3 is a rear view of the photovoltaic module of FIG. 2.

Referring to FIGS. 2 and 3, the photovoltaic module 50 may include a solar cell module 100 and a junction box 200 disposed on the back surface of the solar cell module 100.

The junction box 200 may include at least one bypass diode which is bypassed for the purpose of preventing hot spots when a shaded region occurs.

Figure 4:
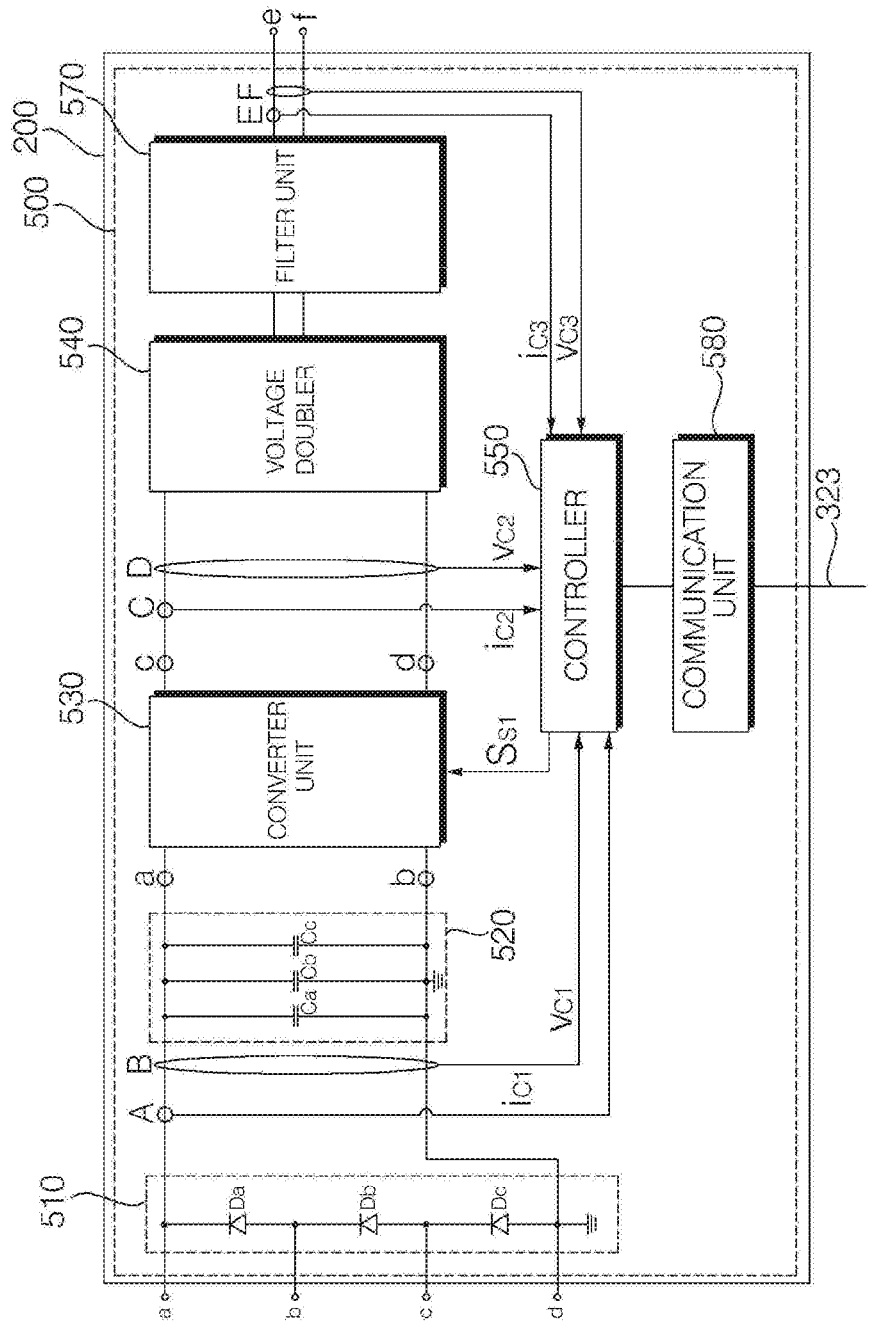
FIG. 4 is a circuit diagram illustrating an internal configuration of a junction box in the photovoltaic module of FIG. 2.

In FIG. 4, three bypass diodes Da, Db, and Dc are illustrated in correspondence to four solar cell strings shown in FIG. 2.

The junction box 200 may convert DC power supplied by the solar cell module 100. This will be described later with reference to FIG. 4.

The solar cell module 100 may include a plurality of solar cells.

In FIG. 2, the plural solar cells are connected in a line by a ribbon (133 of FIG. 11) to form a solar cell string 140. Thereby, 6 strings 140a, 140b, 140c, 140d, 140e, and 140f are formed and each string includes 10 solar cells. However, various modifications may be made.

The solar cell strings may be electrically connected by bus ribbons. In FIG. 2, the first solar cell string 140a and the second solar cell string 140b, the third solar cell string 140c and the fourth solar cell string 140d, and the fifth solar cell string 140e and the sixth solar cell string 140f are electrically connected by bus ribbons 145a, 145c, and 145e, respectively, disposed at a lower portion of the solar cell module 100.

In addition, in FIG. 2, the second solar cell string 140b and the third solar cell string 140c, and the fourth solar cell string 140d and the fifth solar cell string 140e are electrically connected by bus ribbons 145b and 145d, respectively, disposed at the upper portion of the solar cell module 100.

The ribbon connected to the first string 140a, the ribbons 145b and 145d, and the ribbon 145c connected to the sixth string 140e are electrically connected to first to fourth conductive lines, respectively. The first to fourth conductive lines may be connected to the bypass diodes (Da, Db, and Dc of FIG. 4) disposed on the rear surface of the solar cell module 100 through an opening formed on the solar cell module 100.

The opening formed on the solar cell module 100 may be formed in correspondence to a region in which the junction box 200 is disposed.

FIG. 4 is a circuit diagram illustrating an internal configuration of a junction box in the photovoltaic module of FIG. 2.

Referring to FIG. 4, a junction box 200 may convert DC power from a solar cell module 100 and output the converted power.

In association with the present invention, the junction box 200 may include the power conversion device 500 for outputting AC power.

To this end, the junction box 200, particularly, the power conversion device 500, may include a converter unit 530, a voltage doubler 540, and a controller 550 for controlling the converter unit 530 and the voltage doubler 540.

The junction box 200, particularly, the power conversion device 500, may further include a bypass diode unit 510 for performing bypass, a capacitor unit 520 for storing DC power, and a filter unit 570 for filtering AC power.

The junction box 200, particularly, the power conversion device 500, may further include a communication unit 580 for communicating with the gateway 80 disposed at the exterior of the power conversion device 500.

The junction box 200, particularly, the power conversion device 500, may further include an input current detector A, an input voltage detector B, a converter output current detector C, and a converter output voltage detector D, a final output current detector E, and a final output voltage detector F.

The controller 550 may control the converter unit 530, the voltage doubler 540, and the communication unit 580.

The bypass diode unit 510 may include the bypass diodes Dc, Db, and Da disposed between the first to fourth conductive lines of the solar cell module 100. The number of bypass diodes is one or more and is desirably less than the number of conductive lines by one.

The bypass diodes Dc, Db, and Da receive a photovoltaic DC power from the solar cell module 100, particularly, from the first to fourth conductive lines in the solar cell module 100. When a reverse voltage is generated from a DC voltage of at least one of the first to fourth conductive lines, the bypass diodes Dc, Db, and Da may bypass the reverse voltage.

The DC power passing through the bypass diode unit 510 may be input to the capacitor unit 520.

The capacitor unit 520 may store DC power input after passing through the solar cell module 100 and the bypass diode unit 510.

Although the capacitor unit 520 including the capacitors Ca, Cb, and Cc connected in parallel is illustrated in FIG. 4, the plural capacitors may be connected to in series and in parallel or may be serially connected to a ground terminal. Alternatively, the capacitor unit 520 may include only one capacitor.

Since the converter unit 530 includes a first transformer 531 and a second transformer 536 as illustrated in FIG. 5, the capacitor unit 520 of the present invention has a low power difference with an output end of, particularly, the first transformer 531. Therefore, the capacitor unit 520 may include a small-capacity film capacitor rather than an electrolytic capacitor, thereby reducing manufacturing costs.

The converter unit 530 may include a full-bridge switching unit 532, a first transformer 531, and a second transformer 536. The full-bridge switching unit 532 includes first to fourth switching elements S1 to S4. The first transformer 531 has an input terminal connected between the first switching element S1 and the second switching element S2 connected in series and an output terminal connected between the third switching element S3 and the fourth switching element S4 connected in series. The second transformer 536 is connected to the full-bridge switching unit 532 as a half-bridge.

The full-bridge switching unit 532 in the converter unit 530 may covert a first DC power input to the first transformer 531 into a first AC waveform, based on variable duty switching.

The second transformer 536 in the converter unit 530 may amplify the first AC waveform from the full-bridge switching unit 532 and output a second AC waveform.

That is, the converter unit 530 may convert a power using DC power stored in the capacitor unit 520 and output an AC waveform by one stage.

The converter unit 530 according to an embodiment of the present invention will now be described in detail with reference to FIG. 5.

Meanwhile, the switching elements in the converter unit 530 may be turned on/off based on a switching control signal Ss1 from the controller 550.

The voltage doubler 540 may rectify the second AC waveform from the converter unit 530 and increase voltage gain to output a third AC waveform.

To this end, the voltage doubler 540 may include serially connected fifth and sixth switching elements S5 and S6 which are connected to one of output terminals of the second transformer 536, a first capacitor C1 having one terminal connected to the sixth switching element S6, seventh and eighth switching elements S7 and S8 which are connected to the one of the output terminals of the second transformer 536 and are connected in parallel to the fifth and sixth switching elements S5 and S6, and a second capacitor C2 having one terminal connected to the eighth switching element S8.

The fifth to eighth switching elements S5 to S8 in the voltage doubler 540 may be turned on/off based on a switching control signal Ss2 from the controller 550.

Thereby, the voltage doubler 540 may output an AC power having a predetermined frequency. Desirably, the AC power may have the same frequency (about 60 or 50 Hz) as an AC power of the grid.

Meanwhile, the input current detector A may detect an input current ic1 supplied from the solar cell module 100 to the capacitor unit 520.

The input voltage detector B may detect an input voltage Vc1 supplied from the solar cell module 100 to the capacitor unit 520. Herein, the input voltage Vc1 may be the same as a voltage stored in both terminals of the capacitor unit 520.

The detected input current ic1 and input voltage Vc1 may be input to the controller 550.

Meanwhile, the converter output current detector C detects an output current ic2 output from the converter unit 530 and the converter output voltage detector D detects an output voltage Vc2 output from the converter unit 530. The detected output current ic2 and output voltage Vc2 may be input to the controller 550.

Meanwhile, the final output current detector E detects a current ic3 output from the filter unit 570 and the final output voltage detector F detects a voltage Vc3 output from the filter unit 570. The detected current ic3 and voltage Vc3 may be input to the controller 550.

The controller 550 may output control signals for controlling the switching elements of the converter unit 530. Particularly, the controller 550 may output the first switching control signal Ss1 for controlling the first to fourth switching elements S1 to S4 in the converter unit 530 and the second switching control signal Ss2 for controlling the fifth to eighth switching element S5 to S8 in the voltage doubler 540, based on at least one of the detected input current ic1, input voltage Vc1, output current ic2, output voltage Vc2, output current ic3, and output voltage Vc3.

The controller 550 may control the converter unit 530 to calculate a maximum power point of the solar cell module 100 and to output DC power corresponding to a maximum power.

The communication unit 580 may communicate with the gateway 80.

For example, the communication unit 580 may exchange data with the gateway 80 by PLC.

The communication unit 580 may receive a power factor adjustment signal Sph from the gateway 80.

The communication unit 580 may transmit current information, voltage information, and power information of the photovoltaic module 50 to the gateway 80.

The filter unit 570 may be disposed at an output terminal of the voltage doubler 540.

The filter unit 570 may include a plurality of passive elements and adjust a phase difference between an AC current io and an AC voltage Vo output from the voltage doubler 540, based on at least some of the plural passive elements.

FIG. 5 is a circuit diagram of a power conversion device in a photovoltaic module according to an embodiment of the present invention. FIGS. 6A to 9 are views referred to for explaining the power conversion device of FIG. 5.

Referring to FIG. 5, the power conversion device 500 in the photovoltaic module 100 according to an embodiment of the present invention may include the bypass diode unit 510, the capacitor unit 520, the controller 550, the communication unit 580, the input current detector A, the input voltage detector B, the converter output current detector C, the converter output voltage detector D, the final output current detector E, and the final output voltage detector F, illustrated in FIG. 4, in addition to the converter unit 530, the voltage doubler 540, and the filter unit 570, illustrated in FIG. 5.

Hereinafter, a description will be given focusing on the converter unit 530, the voltage doubler 540, and the filter unit 570, illustrated in FIG. 5.

The power conversion device 500 in the photovoltaic module 100 according to an embodiment of the present invention includes the full-bridge switching unit 532, the first transformer 531, and the second transformer. The full-bridge switching unit 532 includes the first to fourth switching elements S1 to S4. The first transformer 531 has an input terminal connected between the first switching element S1 and the second switching element S2 connected in series and an output terminal connected between the third switching element S3 and the fourth switching element S4 connected in series. The second transformer 536 is connected to the full-bridge switching unit 532 as a half-bridge. The full-bridge switching unit 532 may covert a first DC power input to the first transformer 531 into a first AC waveform, based on variable duty switching.

Thereby, DC power boosting and AC power output may be performed by one stage. Particularly, in the photovoltaic module 50 which outputs a power of about 300 to 400 W, DC power level boosting and AC power output are implemented through one stage, thereby reducing manufacturing costs.

Meanwhile, the first DC power input to the converter unit 530 may be DC power output from the solar cell module 100, DC power output from the capacitor unit 520, or DC power output from the bypass diode unit 510.

The voltage doubler 540 may include the serially connected fifth and sixth switching elements S5 and S6 which are connected to one of output terminals of the second transformer 536, the first capacitor C1 having one terminal connected to the sixth switching element S6, the seventh and eighth switching elements S7 and S8 which are connected to the one of the output terminals of the second transformer 536 and are connected in parallel to the fifth and sixth switching elements S5 and S6, and the second capacitor C2 having one terminal connected to the eighth switching element S8.

The fifth switching element S5 and the sixth switching element S6 may be bidirectional switching elements and the seventh switching element S7 and the eighth switching element S8 may also be bidirectional switching elements.

The converter unit 530 may further include a boost capacitor Cs, a blocking capacitor CB, and a first inductor Lik, in addition to the above-mentioned first to fourth switching elements S1 to S4, the first transformer 531, and the second transformer 536.

The blocking capacitor CB is connected between the first transformer 531 and the second transformer 536 to eliminate a DC offset. Thereby, operation efficiency of the second transformer 536 is improved.

The boost capacitor Cs may be connected between a commonly connected terminal of the second switching element S2 and fourth switching element S4 and a ground terminal.

The boost capacitor Cs may store a voltage boosted by the first transformer 531 and the full-bridge switching unit 532.

Particularly, the boost capacitor Cs may store energy, more specifically, a boosted voltage, by an operation of the full-bridge switching unit 532.

The first inductor Lik may be connected between a point between the third switching element S3 and the fourth switching element S4 and an input terminal of the second transformer 536.

Meanwhile, the filter unit 570 may be connected to an output terminal of the voltage doubler 540.

Figure 6A:
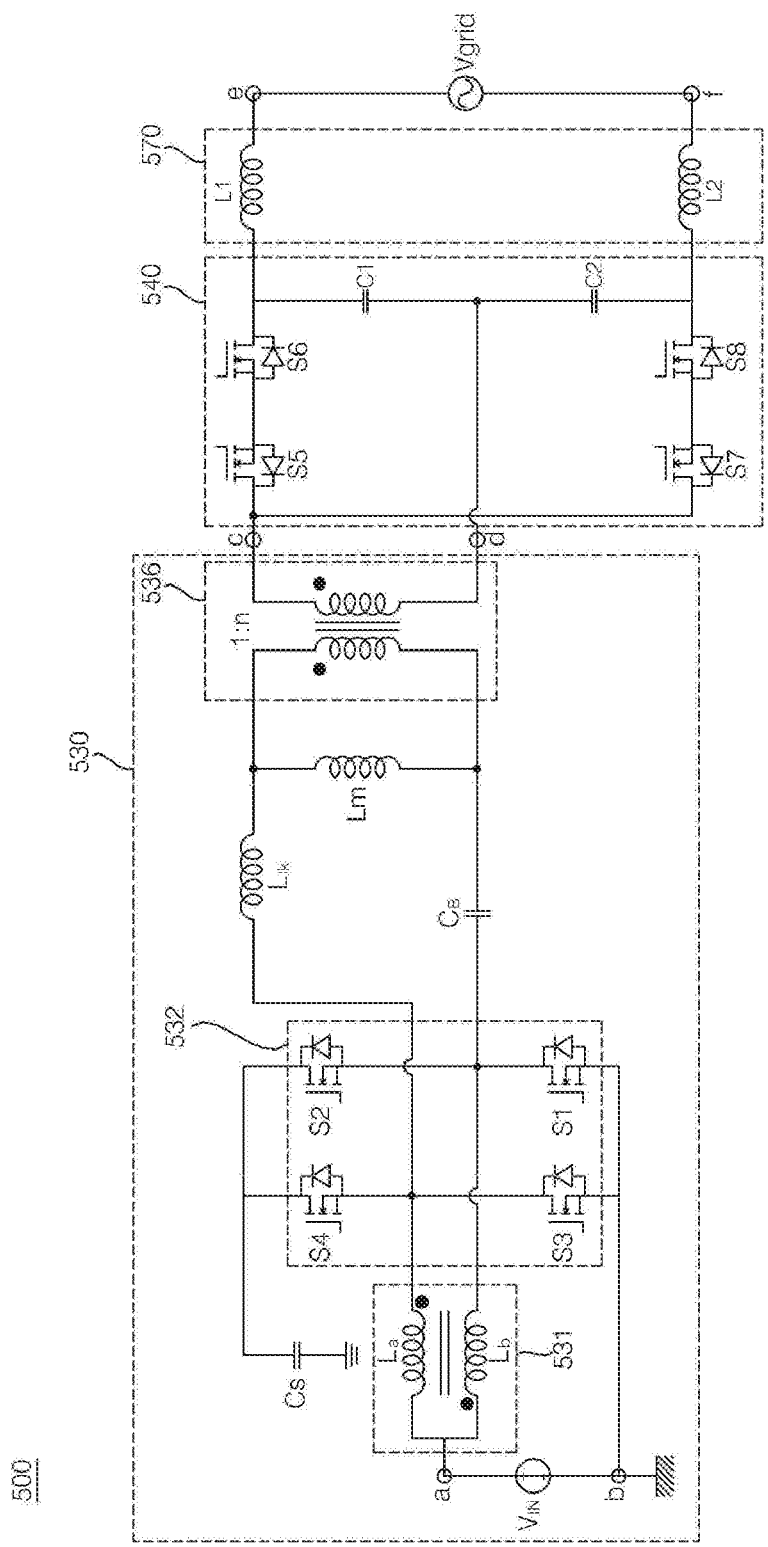
FIGS. 6A to 9 are views referred to for explaining the power conversion device of FIG. 5.
Figure 6B:
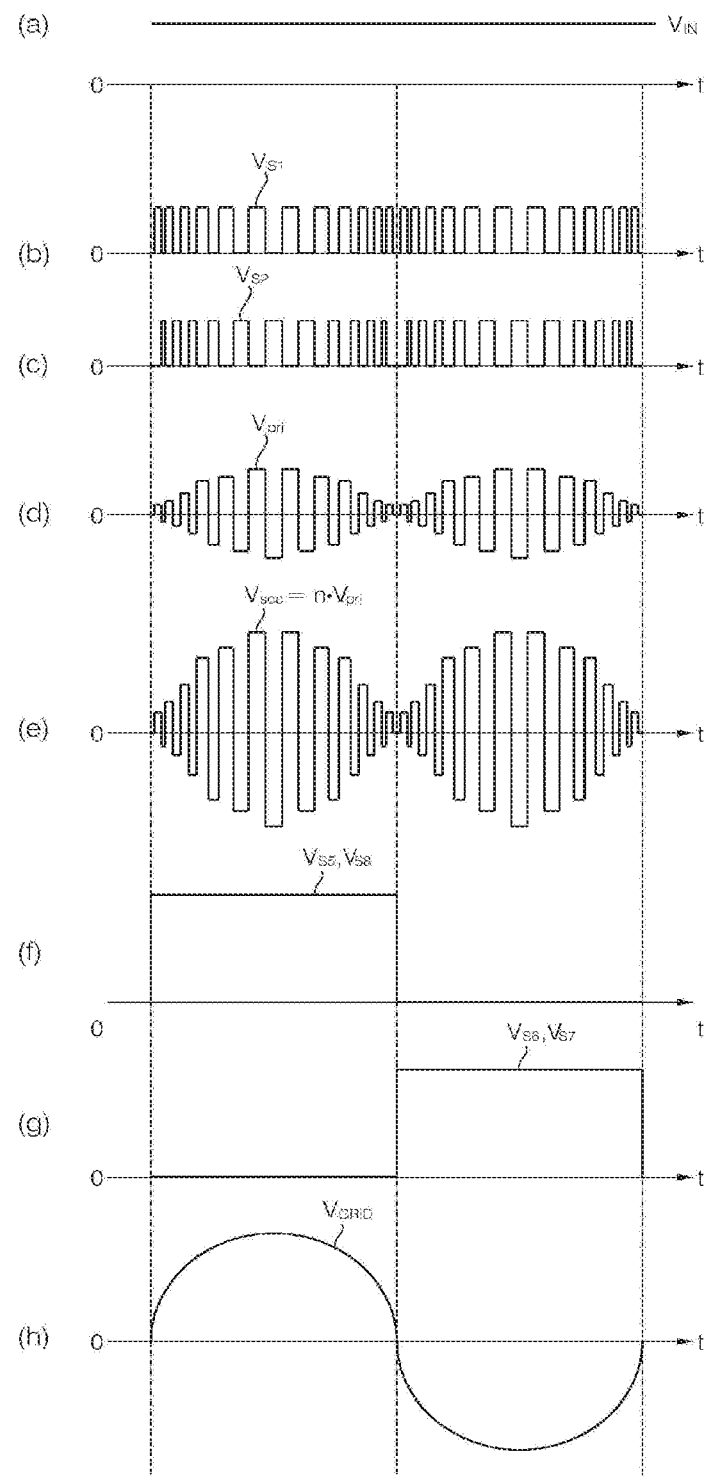

FIGS. 6A and 6B are views referred to for explaining an operation of the power conversion device 500 of FIG. 5.

Referring to FIG. 6A, the full-bridge switching unit 532 may covert the first DC power input to the first transformer 531 into the first AC waveform, based on variable duty switching.

The second transformer 536 may amplify the first AC waveform output from the full-bridge switching unit 532 and output the second AC waveform. Thereby, the power conversion device 500 of the present invention may perform DC power boosting and AC power output by one stage.

The voltage doubler 540 is connected to the output terminal of the second transformer 536 and rectifies the second AC waveform and increases voltage gain by about two times.

The voltage doubler 540 may output an AC power having a grid frequency of 50 Hz or 60 Hz, together with the filter unit 570.

The first transformer 531 and the full-bridge switching unit 532 may operate as an interleaved boost converter.

The first transformer 531 may be a coupled inductor.

An inductor Lb of an input side of the first transformer 531, the first and second switching elements S1 and S2, and the boost capacitor Cs may operate as a first boost converter of the interleaved boost converter.

An inductor La of the output side of the first transformer 531, the third and fourth switching elements S3 and S4, and the boost capacitor Cs may operate as a second boost converter of the interleaved boost converter.

Thereby, the first switching element S1 and the second switching element S2 may operate with a phase difference of 180 degrees from the third switching element S3 and the fourth switching element S4.

That is, the controller 550 may perform a control operation such that the first switching element S1 and second switching element S2 operate with a phase difference of 180 degree from the third switching element S3 and the fourth switching element S4.

The first switching element S1 and the third switching element S3 may perform variable duty switching so that the full-bridge switching unit 532 may output the first AC waveform.

To this end, the controller 550 may perform a control operation such that the first switching element S1 and the third switching element S3 perform variable duty switching.

In this case, a variable duty desirably corresponds to a frequency of the first AC waveform. The frequency of the first AC waveform may be a grid frequency of 50 Hz or 60 Hz.

The controller 550 may output the switching control signal Ss1 to the full-bridge switching unit 532, based on the output current ic3 output from the output current detector E for detecting an output current of the filter unit 570.

The controller 550 may calculate an output power, based on the output current ic3 from the output current detector E and the output voltage Vc3 from the output voltage detector F.

When the output power is a first level or less, the controller 550 may control the full-bridge switching unit 532 to stop switching during a predetermined period. Thus, when the output power is low, since the full-bridge switching unit 532 does not perform a switching operation, unnecessary switching loss can be reduced.

(a) of FIG. 6B illustrates a waveform of the first DC power applied to the first transformer 531. As illustrated, the first DC voltage has a constant level.

(b) and (c) of FIG. 6B illustrate pulse width variable switching control signals applied to gate terminals of the first switching element S1 and third switching element S3 in the full-bridge switching unit 532.

The pulse width of each of the switching control signals is not uniform and varies according to a level of the first AC waveform or the grid frequency waveform.

(d) of FIG. 6B illustrates an output waveform of the full-bridge switching unit 532 or an input waveform of the second transformer 536.

That is, the output waveform of the full-bridge switching unit 532 or the input waveform of the second transformer 536 may be a pulse based first AC waveform Vpri as illustrated (d) of FIG. 6B.

The second transformer 536 may amplify the first Ac waveform Vpri from the full-bridge switching unit 532 and output a second AC waveform Vscc as illustrated in (e) of FIG. 6B.

Next, (f) and (g) of FIG. 6B illustrates pulse width variable switching control signals applied to gate terminals of the fifth and eighth switching elements S5 and S8 and gate terminals of the sixth and seventh switching elements S6 and S7 in the voltage doubler 540.

The filter unit 570 may output an AC power waveform Vgrid having a grid frequency of 50 Hz or 60 Hz as illustrated in (h) of FIG. 6B, by a switching operation of the voltage doubler 540.

FIGS. 7A to 8D are diagrams referred to for explaining operations of the full-bridge switching unit 532 and the voltage doubler 540.

Figure 7A:
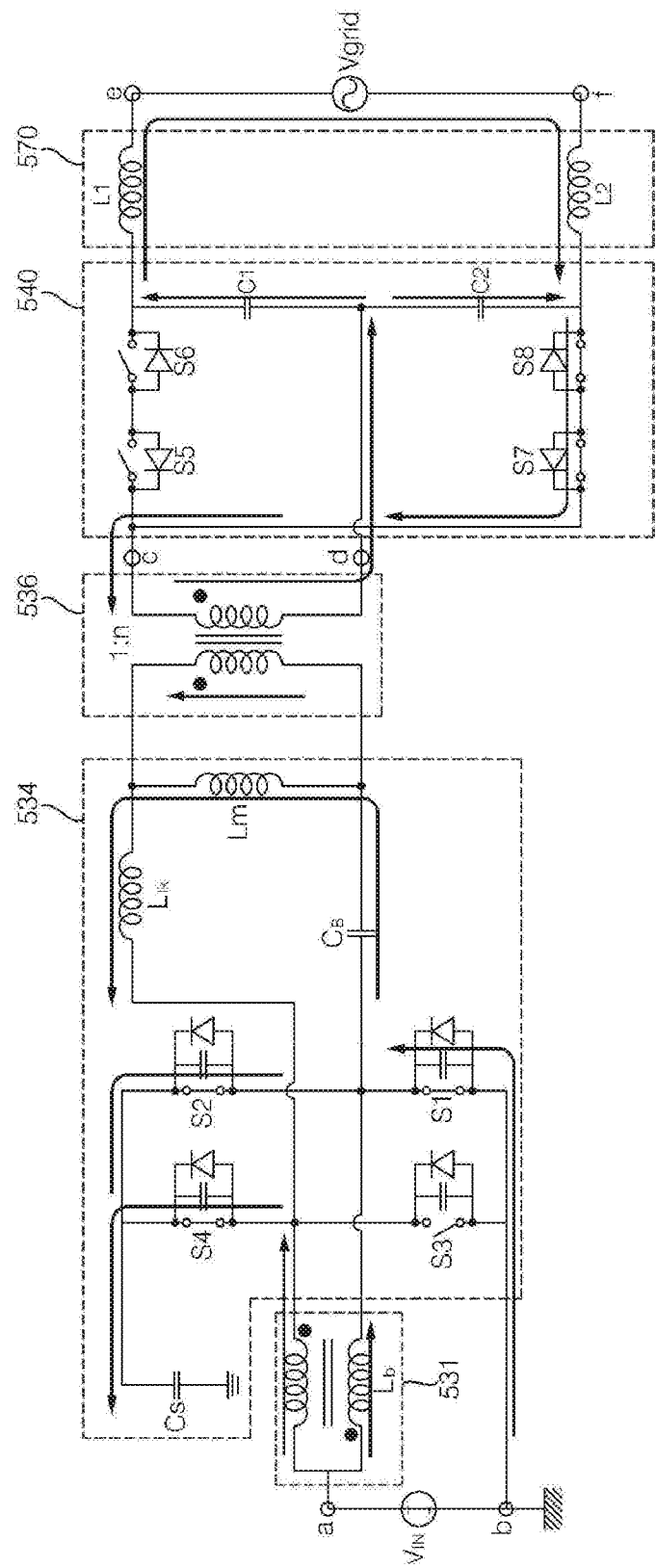

FIG. 7A illustrates a circuit current path in the power conversion device 500 during a dead time until the first switching element S1 is turned on after the second switching element S2 is turned off.

Figure 7B:
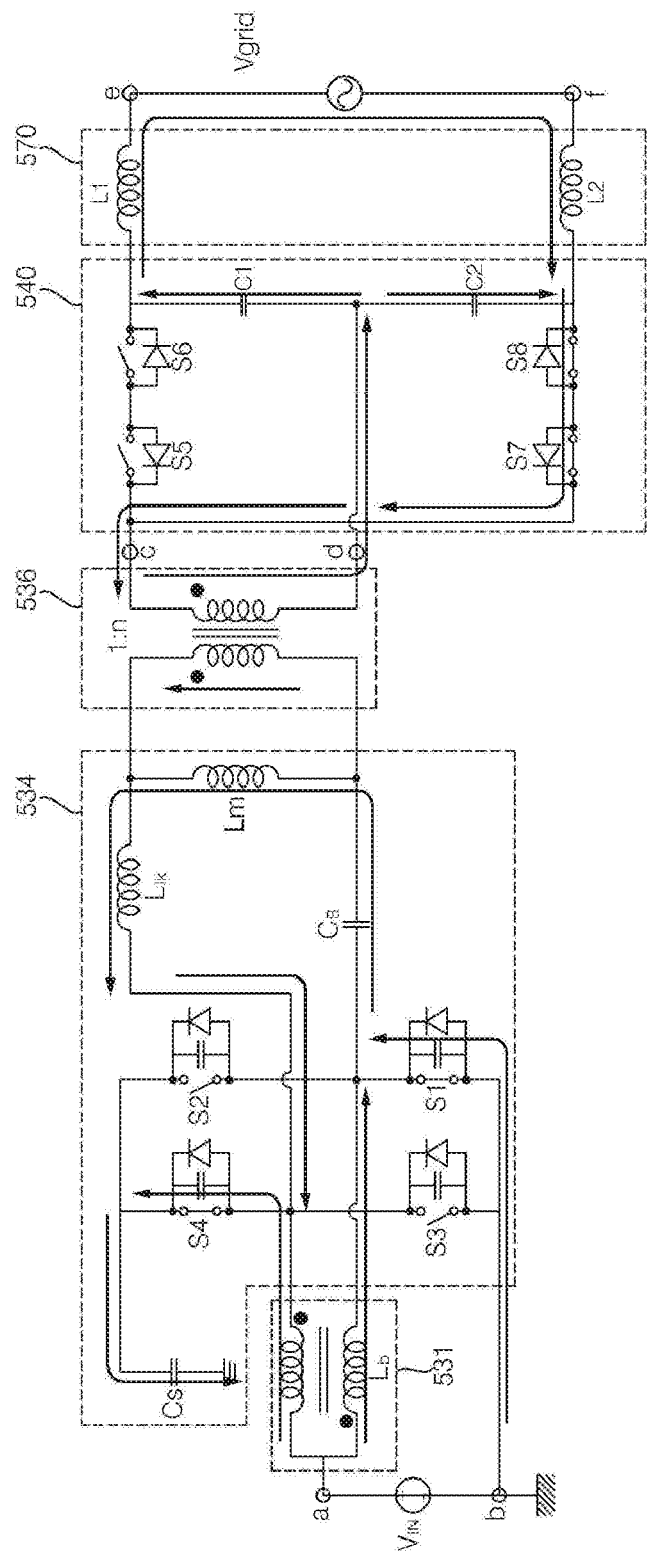

FIG. 7B illustrates a circuit current path in the power conversion device 500 when a body diode of the first switching element S1 is turned on and energy is stored in the boost capacitor Cs, through current flowing into the first inductor Lik.

Figure 7C:
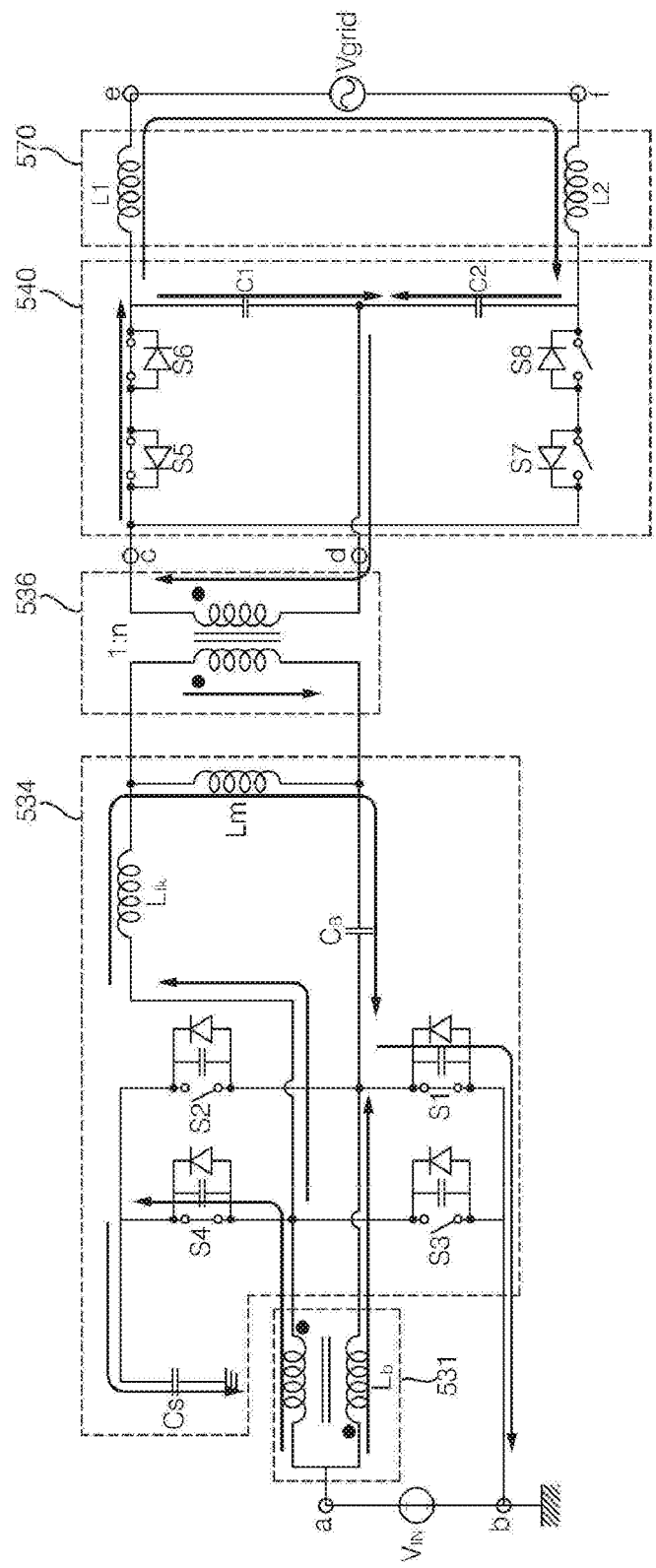

FIG. 7C illustrates a circuit current path in the power conversion device 500 when the first switching element S1 performs ZVS and a body diode of the sixth switching element S6 is turned on, after energy is stored in the boost capacitor Cs.

Referring to FIG. 7C, ZVS is performed based on current flowing into the first inductor Lik in FIG. 7B. Therefore, switching loss can be reduced.

Figure 7D:
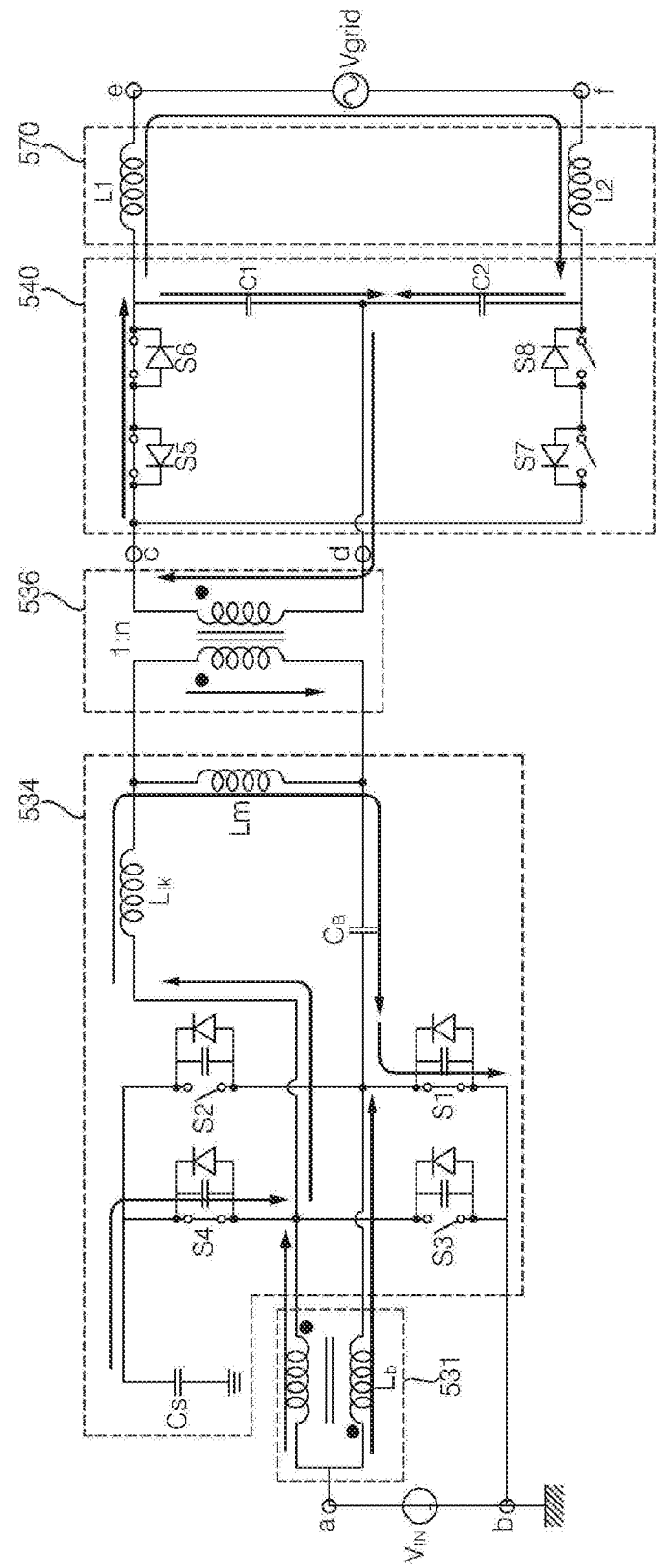

FIG. 7D illustrates a circuit current path in the power conversion device 500 when the sixth switching element S6 is turned on and energy stored in the boost capacitor Cs is output to the output terminal of the second transformer 536, after the first switching element S1 is turned on and a body diode of the sixth switching element S6 is turned on.

Figure 8A:
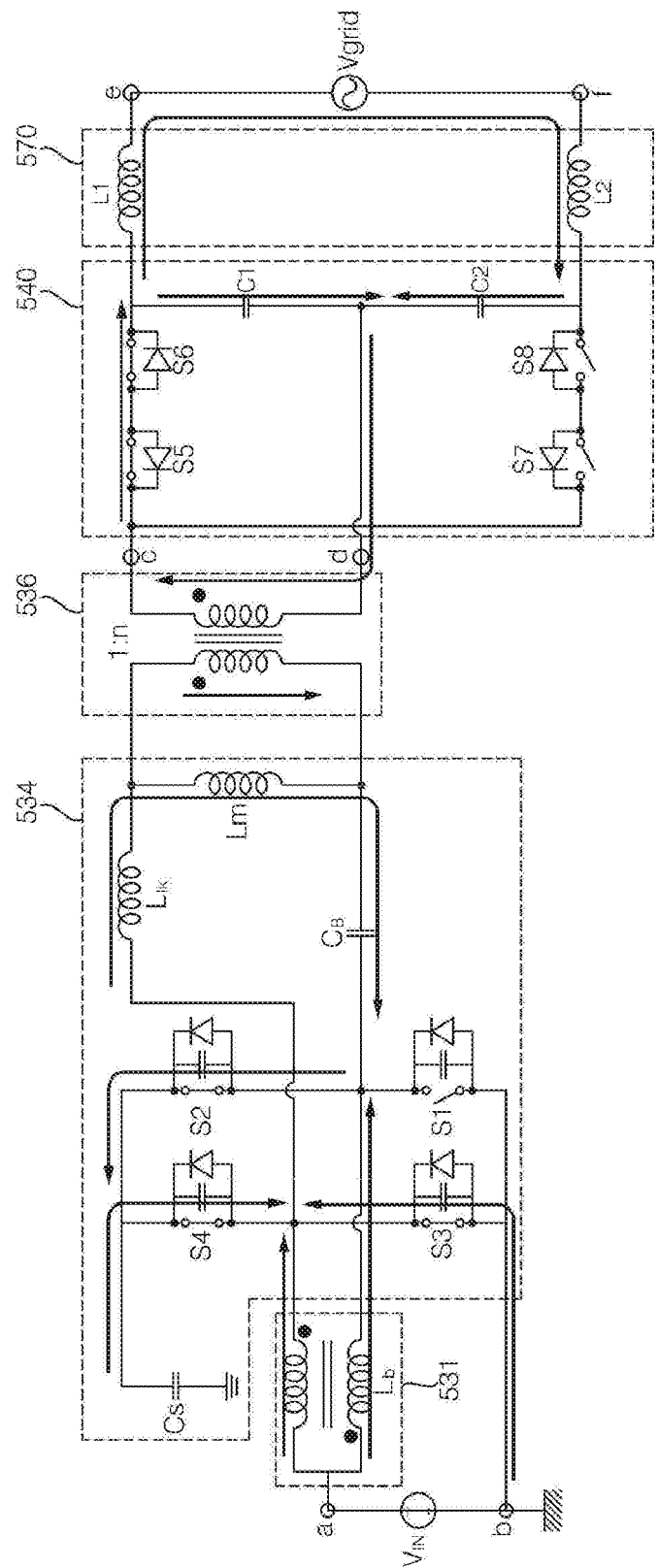

FIG. 8A illustrates a circuit current path in the power conversion device 500 during a dead time until the third switching element S3 is turned on after the fourth switching element S4 is turned off.

Figure 8B:
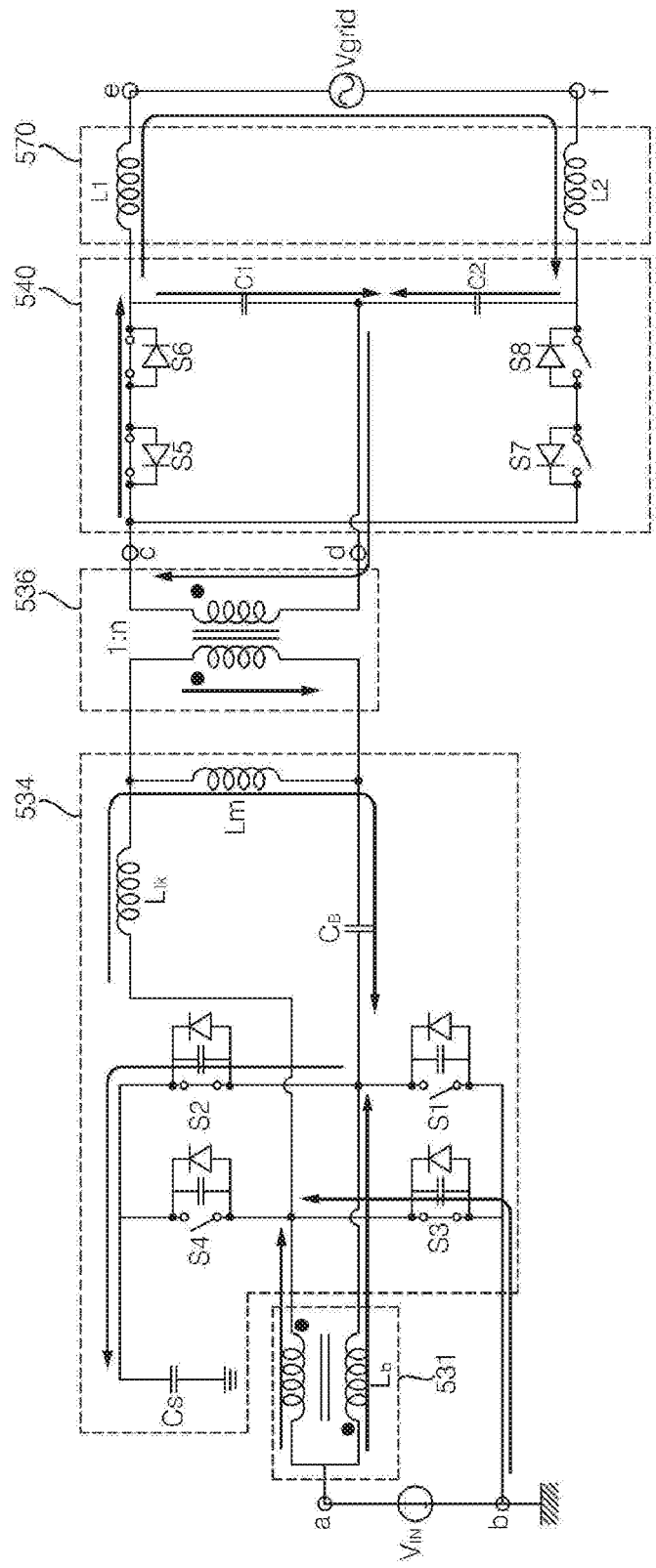

FIG. 8B illustrates a circuit current path in the power conversion device 500 when a body diode of the third switching element S3 is turned on and energy is stored in the boost capacitor Cs, through currents flowing into the first inductor Lik.

Figure 8C:
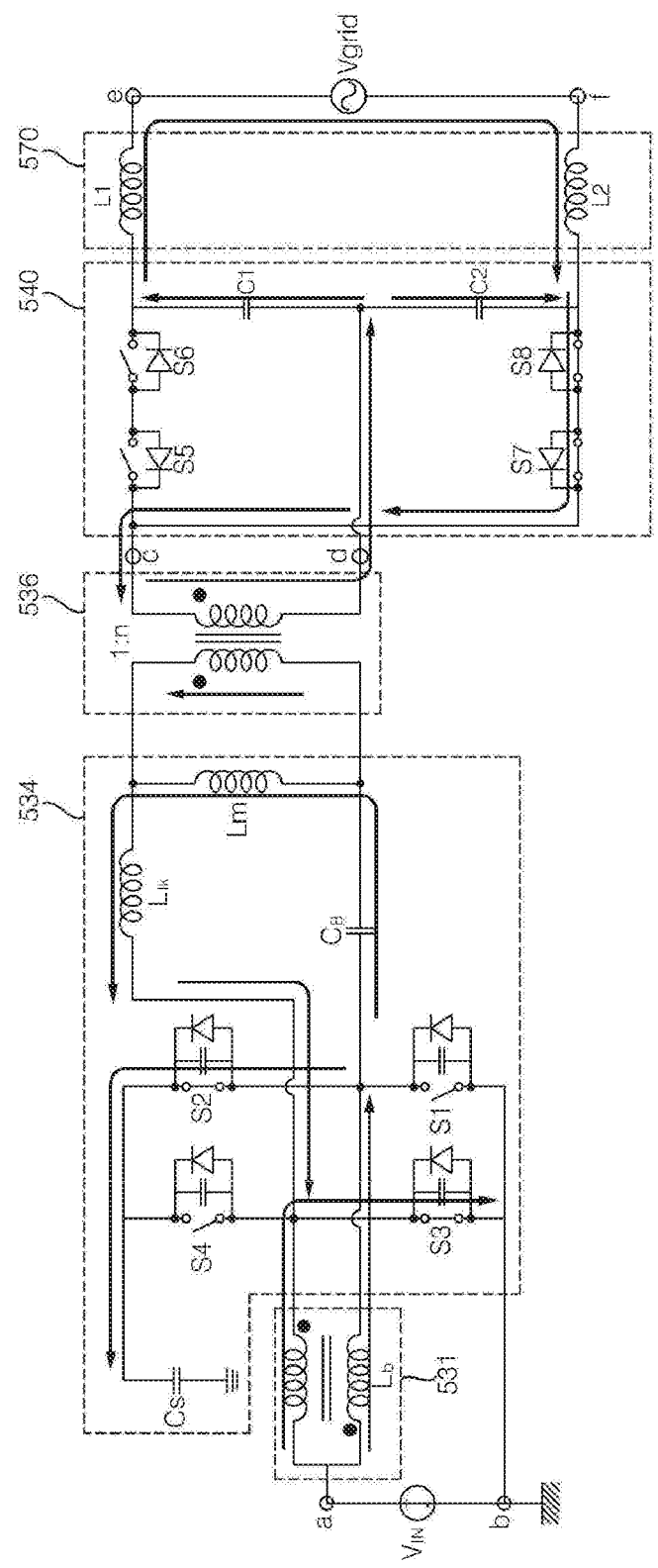

FIG. 8C illustrates a circuit current path in the power conversion device 500 when the third switching element S3 performs ZVS and a body diode of the seventh switching element S7 is turned on, after energy is stored in the boost capacitor Cs.

Referring to FIG. 8C, ZVS is performed based on current flowing into the first inductor Lik in FIG. 8B. Accordingly, switching loss can be reduced.

Figure 8D:
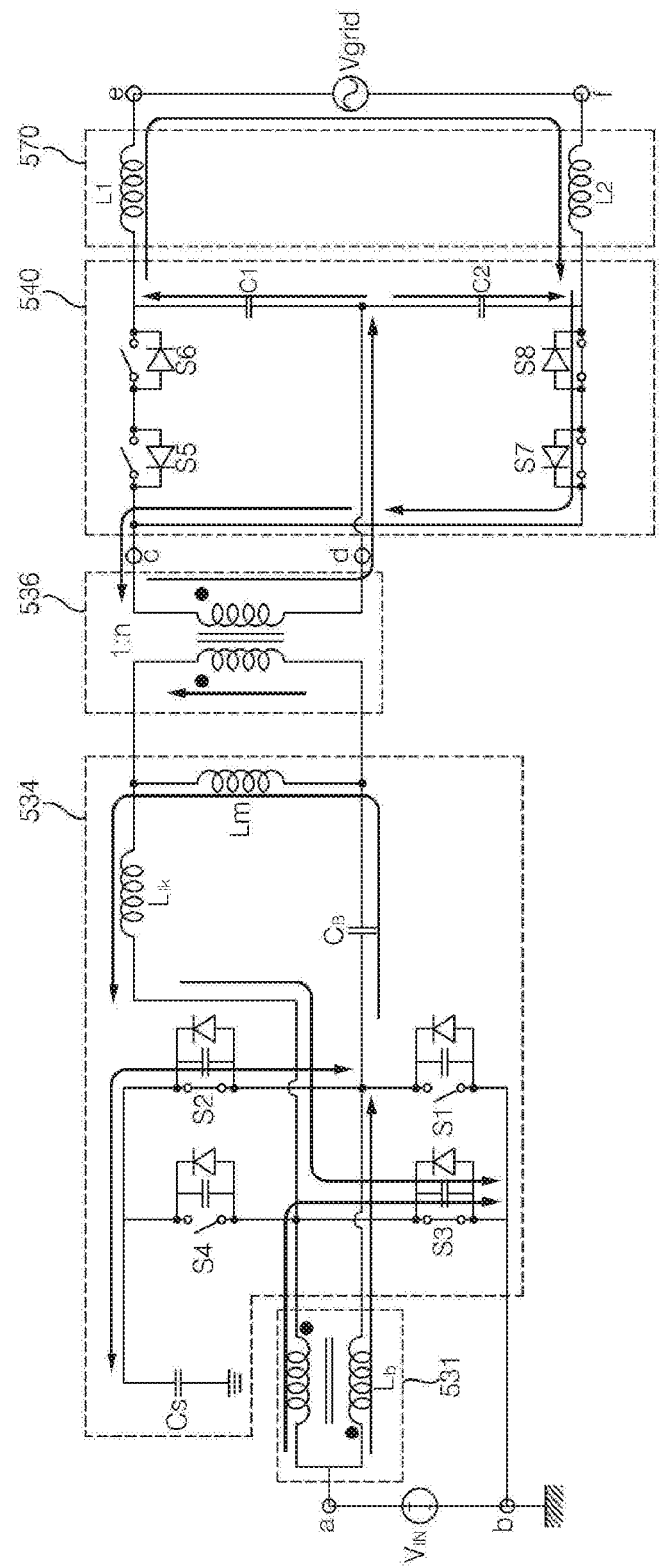

FIG. 8D illustrates a circuit current path in the power conversion device 500 when the seventh switching element S7 is turned on and energy stored in the boost capacitor Cs is output to the output terminal of the second transformer 536, after the third switching element S3 is turned on and a body diode of the seventh switching element S7 is turned on.

Figure 9:
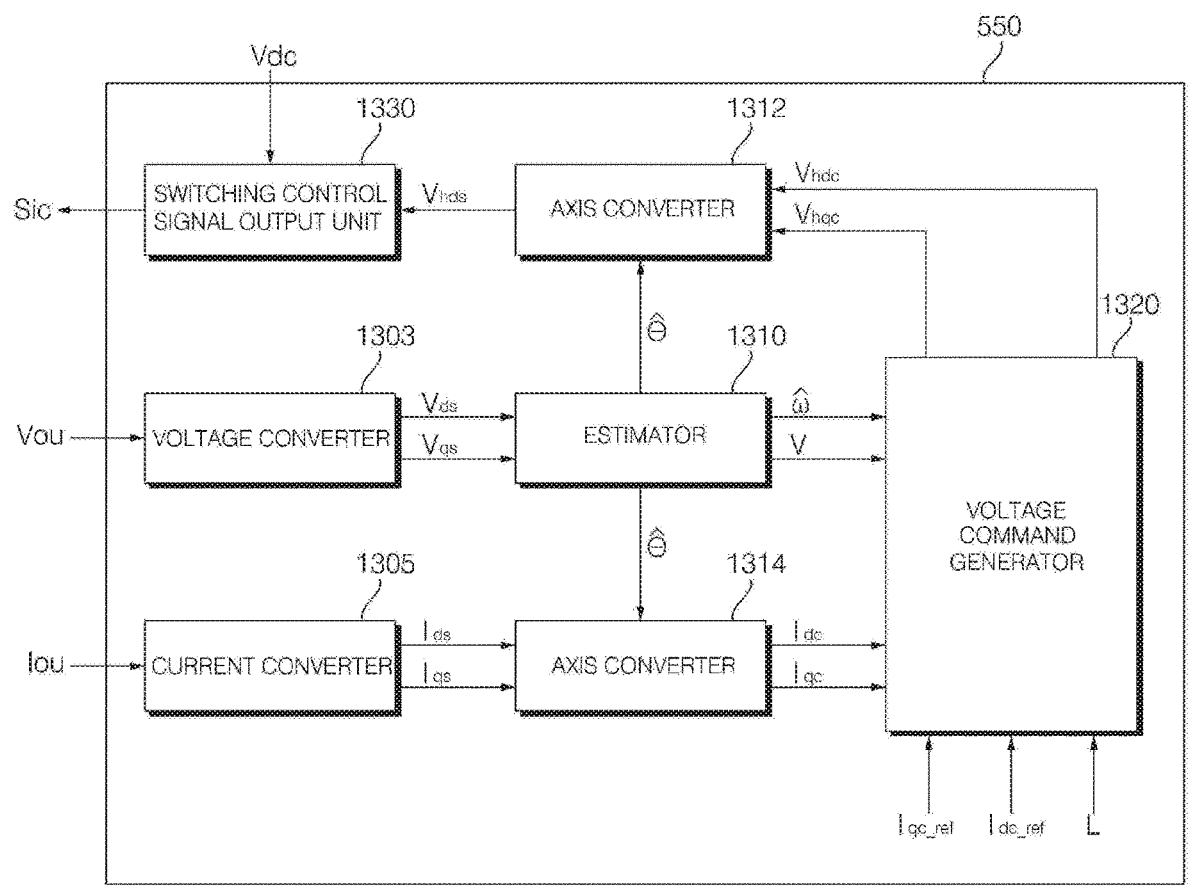

FIG. 9 is a block diagram illustrating an internal configuration of the controller 550 for a power conversion operation.

The controller 550 may include a voltage converter 1303, a current converter 1305, an estimator 1310, an axis converter 1314, an axis converter 1312, a voltage command generator 1320, and a switching control signal output unit 1330.

The voltage converter 1303 may convert a detection voltage Vou from the final output voltage detector F into two-phase voltages Vds and Vqs.

The current converter 1305 may convert a detection current Iou from the final output current detector E into two-phase currents Ids and Iqs.

The estimator 1310 may estimate a phase based on the two-phase voltages Vds and Vqs from the voltage converter 1303 and output an estimated phase $\theta_r$.

The axis converter 1314 converts stationary coordinate system based two-phase currents into rotating coordinate system based two-phase currents Idc and Iqc, based on the two-phase currents Ids and Iqs from the current converter 1305 and the estimated phase $\theta_r$ from the estimator 1319.

The voltage command generator 1320 may output rotating coordinate system based two-phase voltage command values Vhdc and Vhqc, based on the rotating coordinate system based two-phase currents Idc and Iqc, current command values Idc_ref and Iqc_ref, and an inductance.

The axis converter 1312 converts the rotating coordinate system based two-phase voltage command values Vhdc and Vhqc from the voltage command generator 1320 into a stationary coordinate system based two-phase voltage command value Vhds, based on the phase $θ_r$ estimated from the estimator 1310.

The switching control signal output unit 1330 may generate a switching control signal Sic which may be input to gate terminals of the first to fourth switching elements S1 to S4, based on the stationary coordinate system two-phase voltage command value Vhds.

Thereby, the first to fourth switching elements S1 to S4 in the full-bridge switching unit 532 perform switching operations.

Figure 10A:
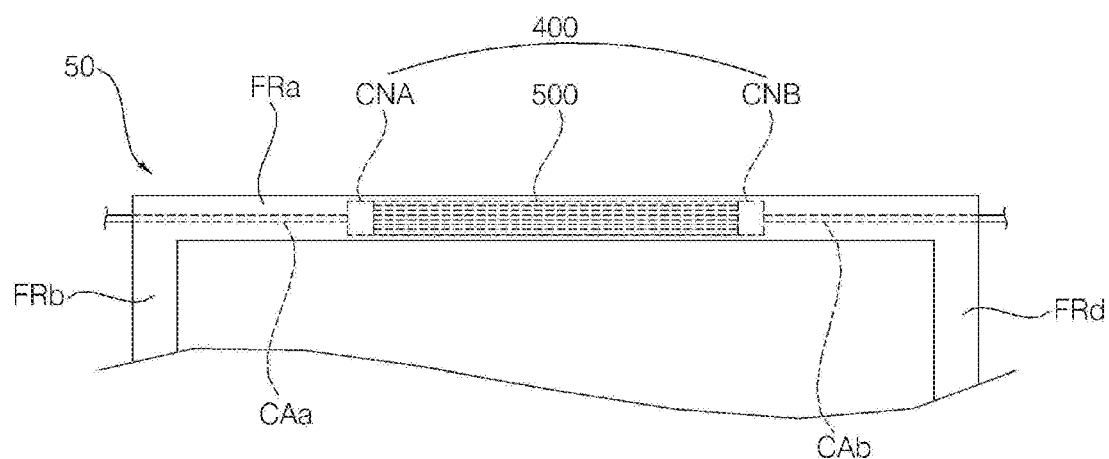
FIGS. 10A to 10B are views referred to for explaining the power conversion device of FIG. 5 mounted in a photovoltaic module.
Figure 10B:
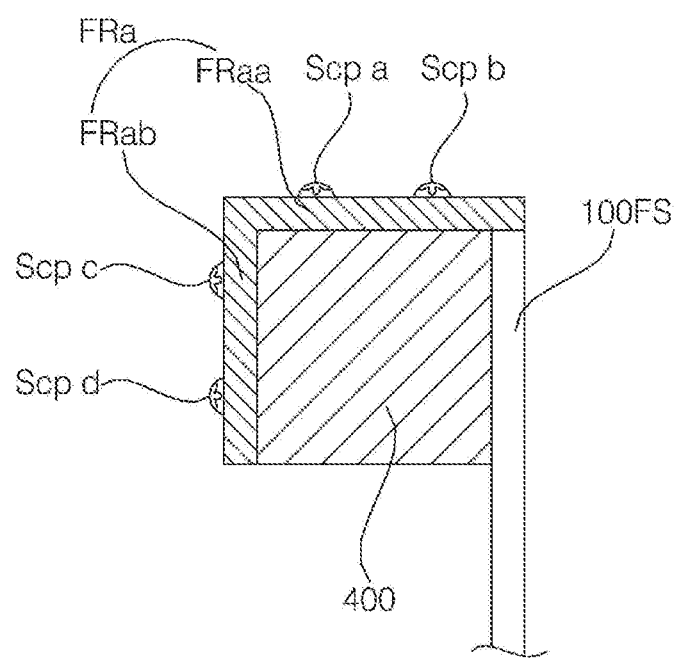

FIGS. 10A to 10B are views referred to for explaining the power conversion device of FIG. 5 mounted in a photovoltaic module.

Referring to FIG. 10A, the power conversion device 500 of FIG. 5 may be disposed in an upper rear frame FRa among rear frames FRa to FRd of the photovoltaic module 50.

Particularly, since the power conversion device 500 of FIG. 5 uses the first transformer 531 and the second transformer 536, the power conversion device 500 can be simplified compared with a conventional device using three or more interleaved converters and is small in volume.

Accordingly, as illustrated in FIG. 3, the power conversion device 500 need not be disposed in the junction box 200 on the back surface of the photovoltaic module 50.

As a result, as illustrated in FIG. 10A, the power conversion device 500 may be embedded in or attached to the upper rear frame FRa among the rear frames FRa to FRd of the photovoltaic module 50.

Specifically, a first cable connector CNA and a second cable connector CNB are disposed on both lateral surfaces of the power conversion device 500 and the first cable connector CNA, the second cable connector CNB, and the power conversion device 500 may configure a power conversion module 400 which is one module.

That is, the power conversion module 400 may include the first cable connector CNA, the second cable connector CNB, and the power conversion device 500.

Meanwhile, respective AC power cables CAa and Cab are extended to each of the first cable connector CNA and the second cable connector CNB and may be connected to a power conversion device of a neighbor photovoltaic module.

The power conversion module 400 is coupled to the upper rear frame FRa among the rear frames FRa to FRd of the photovoltaic module 50 in a sliding manner and may be fixed to an opening by a screw etc. Coupling in a screw manner will now be described with reference to FIG. 10B.

FIG. 10B is a side view illustrating the photovoltaic module 50 having a solar cell module 100FS.

Referring to FIG. 10B, the power conversion module 400 may be attached to or detached from the upper rear frame FRa. To this end, a fastening member (e.g., a screw) may be coupled to an opening formed on the upper rear frame FRa.

In FIG. 10B, the upper rear frame FRa has a shape of "¬" and includes a first frame FRaa and a second frame FRab which cross each other.

A plurality of openings may be formed on each of the first frame FRaa and the second frame FRab and a plurality of screws Scpa, Scpb, Scpc, and Scpd may be fastened to the respective openings.

Among the screws Scpa, Scpb, Scpc, and Scpd, since a fastening direction of the first and second screws Scpa and Scpb and an engaging direction of the third and fourth screws Scpc and Scpd cross, fastening force is improved and the power conversion module 400 is firmly fixed to the upper rear frame FRa.

Figure 11:
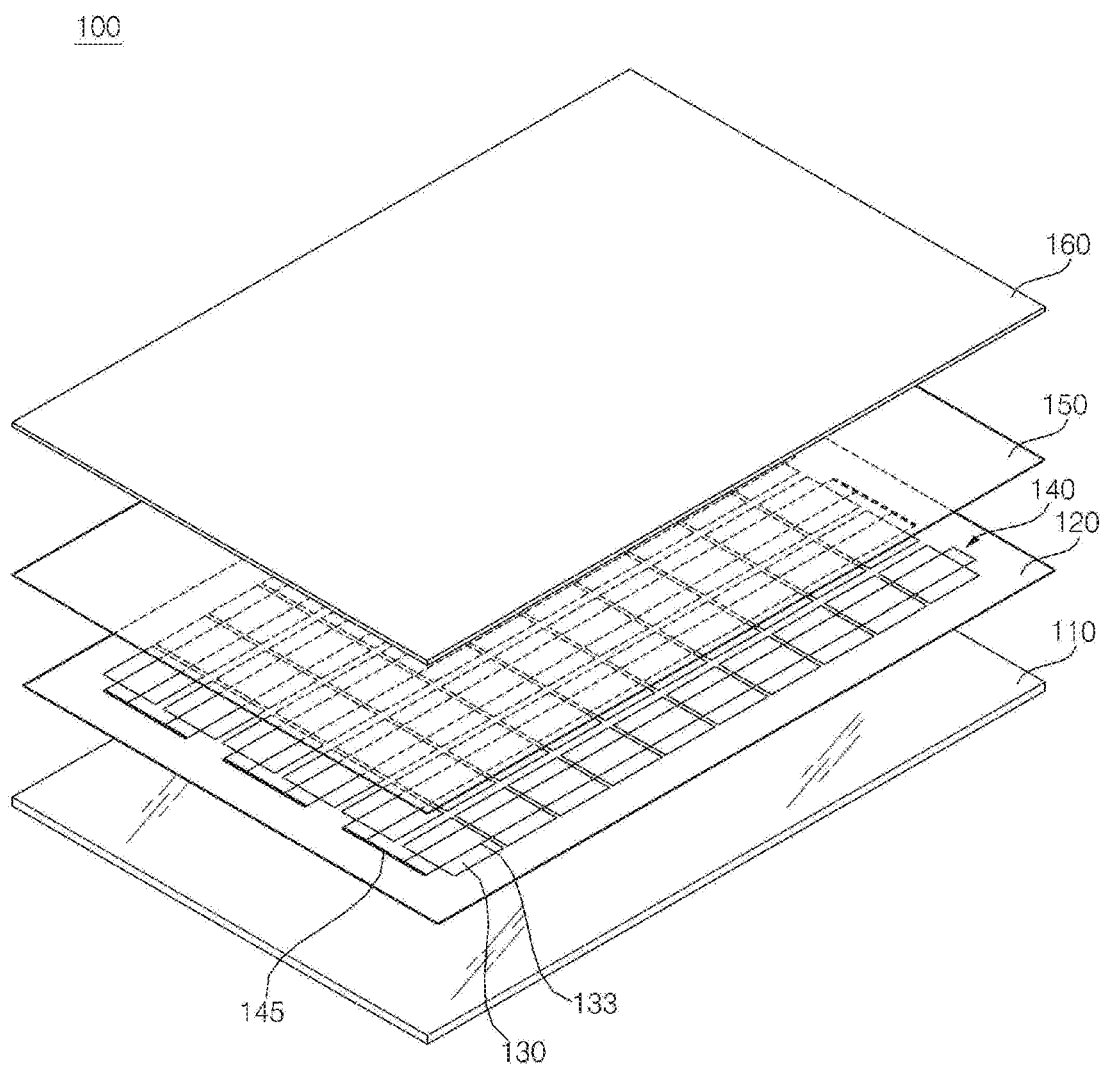
FIG. 11 is an exploded perspective view of a solar cell module illustrated in FIG. 2.

FIG. 11 is an exploded perspective view of a solar cell module illustrated in FIG. 2.

Referring to FIG. 11, the solar cell module 100 of FIG. 2 may include a plurality of solar cells 130. The solar cell module 100 may further include a first sealing member 120 and a second sealing member 150, which are respectively disposed on the lower surface and the upper surface of the solar cells 130, a back substrate 110 disposed on a lower surface of the first sealing member 120, and a front substrate 160 disposed on the upper surface of the second sealing member 150.

The solar cells 130 are semiconductor devices which convert sunlight into electrical energy and may be silicon solar cells, compound semiconductor solar cells, tandem solar cells, dye sensitized solar cells, CdTe type solar cells, CIGS type solar cells, or thin-film solar cells.

Each of the solar cells 130 includes a light-receiving surface on which sunlight is incident and a back surface opposite to the light-receiving surface. For example, each of the solar cells 130 may include a silicon substrate of a first conductive type, a semiconductor layer of a second conductive type formed on the silicon substrate, the second conductive type being opposite to the first conductive type, an anti-reflective layer formed on the semiconductor layer of the second conductive type and having at least one opening for exposing a surface portion of the semiconductor layer of the second conductive, a front electrode formed in contact with the surface portion of the semiconductor layer of the second conductive exposed through the opening, and a back electrode formed on the back surface of the silicon substrate.

The solar cells 130 may be electrically connected to each other in series, in parallel, or in series and in parallel. More specifically, the solar cells 130 may be electrically connected to each other by a ribbon 133. The ribbon 133 may be bonded to the front electrode formed on the light-receiving surface of one solar cell 130 and the back electrode formed on the back surface of another adjacent solar cell 130.

In FIG. 11, the ribbon 133 is formed in two rows. The solar cells 133 are connected in a line by the ribbon 133 to form a solar cell string 140.

Thus, as illustrated in FIG. 2, 6 strings 140*a*, 140*b*, 140*c*, 140*d*, 140*e*, and 140*f* are formed and each string may include 10 solar cells.

The back substrate 110 may be a back sheet having waterproof, insulation, and ultraviolet blocking functions and may be, without being limited to, a Tedlar/PET/Tedlar (TPT) type. While the back substrate 110 is illustrated as having a rectangular shape in FIG. 4, the back substrate 110 may be fabricated in various other shapes such as circular and semicircular shapes, according to an environment in which the solar cell module 100 is installed.

Meanwhile, the first sealing member 120 having the same size as the back substrate 110 may be attached to the back substrate 110 and the solar cells 130 may be adjacently disposed so as to form several columns on the first sealing member 120.

The second sealing member 150 may be disposed over the solar cells 130 and may be bonded to the first sealing member 120 via lamination.

In this case, the first sealing member 120 and the second sealing member 150 enable respective elements of the solar cells 130 to be chemically bonded. The first sealing member 120 and the second sealing member 150 may be formed of various materials such as ethylene vinyl acetate (EVA) films.

Meanwhile, the front substrate 160 may be disposed on the second sealing member 150 so as to transmit sunlight therethrough. The front substrate 160 may be formed of tempered glass in order to protect the solar cells 130 from external shock, etc. In addition, in order to prevent reflection of sunlight and raise transmittance of sunlight, the front substrate 160 may be formed of low-iron tempered glass.

As is apparent from the above description, the power conversion device and the photovoltaic module including the same include a full-bridge switching unit, a first transformer, and a second transformer. The full-bridge switching unit includes first to fourth switching elements. The first transformer has an input terminal connected between the first switching element and the second switching element connected in series and an output terminal connected between the third switching element and the fourth switching element connected in series. The second transformer is connected to the full-bridge switching unit as a half-bridge. The full-bridge switching unit coverts a first DC power input to the first transformer into a first AC waveform, based on variable duty switching. Thereby, DC power boosting and AC power output can be performed by one stage.

In addition, switching loss can be reduced in the power conversion device of one stage.

In addition, the first switching element can perform ZVS based on current flowing into a first inductor and thus switching loss can be reduced in the power conversion device of one stage.

Meanwhile, since a DC component is eliminated due to a blocking capacitor, operation efficiency of the second transformer can be improved.

In addition, an AC waveform of the second transformer can be rectified due to a voltage doubler and voltage gain can be increased.

The photovoltaic module and the photovoltaic module including the same according to the present invention should not be limited to configurations and methods of the above-described embodiments and all or some of the embodiments may be selectively combined with one another to achieve various alterations.

While the present invention has been particularly shown and described with reference to exemplary embodiments thereof, it will be understood by those of ordinary skill in the art that various changes in form and detail may be made herein without departing from the spirit and scope of the present invention as defined by the following claims and such modifications and variations should not be understood individually from the technical idea or aspect of the present invention.

What is claimed is:

1. A power conversion device, comprising:
a coupled inductor having a first inductor and second inductor, connected to a DC source;
a full-bridge switching unit including a first leg having a first switching element and a second switching element serially connected to the first switching element, and a second leg having a third switching element and a fourth switching element serially connected to the third switching element, wherein the first leg connected to the first inductor and the second leg connected to the second inductor;
a transformer connected to the full-bridge switching unit;
a third inductor connected in parallel with the transformer;
a storage capacitor connected to the full-bridge switching unit;
a voltage doubler connected to an output terminal of the transformer and to rectify a second AC waveform and increase voltage gain; and
a filter unit including a plurality of inductors connected to an output terminal of the voltage doubler.

2. The power conversion device according to claim 1, further comprising a fourth inductor between the second leg and the transformer.

3. The power conversion device according to claim 1, further comprising a blocking capacitor between the first leg and the transformer.

4. The power conversion device according to claim 1, wherein the transformer amplifies a first AC waveform from the full-bridge switching unit and outputs the second AC waveform.

5. The power conversion device according to claim 1, wherein the voltage doubler includes:
fifth and sixth switching elements connected in series and connected to one of output terminals of the transformer;
a first capacitor having one terminal connected to the sixth switching element;
seventh and eighth switching elements connected to the one of the output terminals of the transformer and connected to the fifth and sixth switching elements in parallel; and
a second capacitor having one terminal connected to the eighth switching element.

6. The power conversion device according to claim 5, wherein the fifth and sixth switching elements are bidirectional switching elements, and the seventh and eighth switching elements are bidirectional switching elements.

7. The power conversion device according to claim 1, wherein the first switching element and the second switching element operate with a phase difference of 180 degrees from the third switching element and the fourth switching element.

8. The power conversion device according to claim 1, wherein the first switching element and the third switching element perform variable duty switching, and a variable duty corresponds to a frequency of a first AC waveform.

9. The power conversion device according to claim 1, further comprising:
an output current detector to detect an output current of the filter unit; and
a controller to output a switching control signal to the full-bridge switching unit, based on the output current.

10. The power conversion device according to claim 9, wherein the controller controls the full-bridge switching unit to stop switching during a predetermined period, when an output power of the filter unit is a first level or less.

11. A power conversion device, comprising:
a coupled inductor having a first inductor and second inductor, connected to a DC source;
a full-bridge switching unit including a first leg having a first switching element and a second switching element serially connected to the first switching element, and a second leg having a third switching element and a fourth switching element serially connected to the third switching element, wherein the first leg connected to the first inductor and the second leg connected to the second inductor;

a transformer connected to the full-bridge switching unit;
a third inductor connected in parallel with the transformer;
a storage capacitor connected to the full-bridge switching unit; and
a boost capacitor to store a voltage boosted by the coupled inductor and the full-bridge switching unit,
wherein the coupled inductor and the full-bridge switching unit operates as an interleaved boost converter.

12. The power conversion device according to claim 11, wherein the boost capacitor is connected between a commonly connected terminal of the second switching element and the fourth switching element and a ground terminal.

13. The power conversion device according to claim 11, further comprising:
a fourth inductor between the second leg and the transformer,
wherein a body diode of the first switching element is turned on and energy is stored in the boost capacitor, through current flowing into the fourth inductor.

14. The power conversion device according to claim 13, wherein the first switching element performs zero-voltage switching and a body diode of a sixth switching element is turned on, after energy is stored in the boost capacitor.

15. The power conversion device according to claim 14, wherein the sixth switching element is turned on and energy stored in the boost capacitor is output to an output terminal of the transformer, after the body diode of the sixth switching element is turned on.

16. The power conversion device according to claim 13, wherein the third switching element performs zero-voltage switching and a body diode of a seventh switching element is turned on, after energy is stored in the boost capacitor.

17. The power conversion device according to claim 16, wherein the seventh switching element is turned on and energy stored in the boost capacitor is output to an output side of the transformer, after the body diode of the seventh switching element is turned on.

18. A photovoltaic module, comprising:
a solar cell module including a plurality of solar cells; and
a power conversion device,
wherein the power conversion device includes:
a coupled inductor having a first inductor and second inductor, connected to a DC source;
a full-bridge switching unit including a first leg having a first switching element and a second switching element serially connected to the first switching element, and a second leg having a third switching element and a fourth switching element serially connected to the third switching element, wherein the first leg connected to the first inductor and the second leg connected to the second inductor;
a transformer connected to the full-bridge switching unit;
a third inductor connected in parallel with the transformer; and
a storage capacitor connected to the full-bridge switching unit,
wherein the transformer amplifies a first AC waveform from the full-bridge switching unit and outputs a second AC waveform, and
wherein the power conversion device further includes:
a voltage doubler connected to an output terminal of the transformer and to rectify the second AC waveform and increase voltage gain, and
a filter unit including a plurality of inductors connected to an output terminal of the voltage doubler.

19. The photovoltaic module according to claim 18, wherein the power conversion device further comprises a fourth inductor between the second leg and the transformer.

20. The photovoltaic module according to claim 18, wherein the power conversion device further comprises a blocking capacitor between the first leg and the transformer.

* * * * *